United States Patent
van der Straten et al.

(10) Patent No.: US 11,758,819 B2
(45) Date of Patent: Sep. 12, 2023

(54) MAGNETO-RESISTIVE RANDOM ACCESS MEMORY WITH LATERALLY-RECESSED FREE LAYER

(71) Applicant: International Business Machines Corporation, Armonk, NY (US)

(72) Inventors: Oscar van der Straten, Guilderland Center, NY (US); Koichi Motoyama, Clifton Park, NY (US); Kenneth Chun Kuen Cheng, Shatin (HK); Joseph F. Maniscalco, Lake Katrine, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 17/122,809

(22) Filed: Dec. 15, 2020

(65) Prior Publication Data
US 2022/0190235 A1 Jun. 16, 2022

(51) Int. Cl.
| | |
|---|---|
| *H10N 50/10* | (2023.01) |
| *G11C 11/16* | (2006.01) |
| *H10B 61/00* | (2023.01) |
| *H10N 50/01* | (2023.01) |
| *H10N 50/80* | (2023.01) |
| *H10N 50/85* | (2023.01) |

(52) U.S. Cl.
CPC ............ *H10N 50/10* (2023.02); *G11C 11/161* (2013.01); *H10B 61/00* (2023.02); *H10N 50/01* (2023.02); *H10N 50/80* (2023.02); *H10N 50/85* (2023.02)

(58) Field of Classification Search
CPC ........ H10N 50/10; H10N 50/80; H10N 50/01; H10N 50/85; H10B 61/00; G11C 11/161

USPC ......................................................... 257/421
See application file for complete search history.

(56) References Cited

U.S. PATENT DOCUMENTS

| | | | |
|---|---|---|---|
| 6,469,879 B1 | 10/2002 | Redon | |
| 8,482,883 B2 | 7/2013 | Dimitrov | |
| 8,675,318 B1 * | 3/2014 | Ho | G11B 5/3912 |
| | | | 360/324.11 |
| 9,559,294 B2 * | 1/2017 | Hsu | H10N 50/01 |
| 10,249,329 B1 * | 4/2019 | Hu | G11B 5/3912 |

(Continued)

FOREIGN PATENT DOCUMENTS

WO 2022128646 A1 6/2022

OTHER PUBLICATIONS

International Search Report and Written Opinion, International Application No. PCT/EP2021/084668, dated Apr. 7, 2022, 11 pages.

(Continued)

*Primary Examiner* — Jami Valentine Miller
(74) *Attorney, Agent, or Firm* — Michael A. Petrocelli

(57) ABSTRACT

A memory device, and a method of forming the same, includes a bottom electrode above an electrically conductive structure, the electrically conductive structure is embedded in an interconnect dielectric material. A magnetic tunnel junction stack located above the bottom electrode is formed by a magnetic reference layer above the bottom electrode, a tunnel barrier layer above the magnetic reference layer, and a laterally-recessed magnetic free layer above the tunnel barrier layer. Sidewall spacers surround the laterally-recessed magnetic free layer for confining an active region formed by the laterally-recessed magnetic free and the tunnel barrier layer.

8 Claims, 8 Drawing Sheets

(56) References Cited

U.S. PATENT DOCUMENTS

| | | | |
|---|---|---|---|
| 10,580,966 B1 | 3/2020 | Van Der Straten | |
| 10,700,264 B2* | 6/2020 | Liao | H10N 50/01 |
| 10,777,222 B1* | 9/2020 | Liu | G11B 5/3909 |
| 11,579,344 B2* | 2/2023 | Josell | G02B 5/1857 |
| 2009/0209050 A1 | 8/2009 | Wang | |
| 2010/0232072 A1 | 9/2010 | Dimitrov | |
| 2011/0049655 A1 | 3/2011 | Assefa | |
| 2015/0287907 A1* | 10/2015 | Park | H10N 50/01 |
| | | | 257/421 |
| 2016/0035378 A1* | 2/2016 | Quan | G11B 5/3912 |
| | | | 216/22 |
| 2016/0225979 A1* | 8/2016 | Hsu | H10N 50/10 |
| 2019/0286210 A1 | 9/2019 | Takayanagi | |
| 2020/0075669 A1* | 3/2020 | Chuang | H10N 50/10 |
| 2020/0168791 A1* | 5/2020 | Hsu | H10B 61/10 |
| 2020/0235286 A1 | 7/2020 | Marchack | |
| 2020/0321394 A1 | 10/2020 | Hashemi | |
| 2022/0093684 A1* | 3/2022 | Chuang | H10N 50/80 |
| 2023/0070777 A1* | 3/2023 | Lee | H10N 50/01 |

OTHER PUBLICATIONS

Van Der Straten, et al., "Magneto-Resistive Random Access Memory With Laterally-Recessed Free Layer", International Application No. PCT/EP2021/084668, International Filing Date Dec. 7, 2021, 22 pages.

* cited by examiner

_US 11,758,819 B2_

MAGNETO-RESISTIVE RANDOM ACCESS MEMORY WITH LATERALLY-RECESSED FREE LAYER

BACKGROUND

The present invention generally relates to the field of magnetic storage devices, and more particularly to high performance magneto-resistive random access memory devices.

Magneto-resistive random access memory (MRAM) is a non-volatile random access memory technology in which data is stored by magnetic storage elements. These magnetic storage elements are typically formed from two ferromagnetic plates, each of which can hold a magnetization, separated by a thin dielectric layer, i.e., the tunnel barrier. One of the two plates is a permanent magnetic set to a particular polarity; the other plate's magnetization can be changed to match that of an external field to store memory. Such configuration is known as a magnetic tunnel junction (MTJ) pillar.

For high performance MRAM devices based on perpendicular MTJ pillars, well-defined interfaces and interface control are essential. Embedded MTJ pillar structures are usually formed by patterning of blanket MTJ stacks. Reactive ion etch (RIE), and ion beam etch (IBE) processing of such MTJ stacks presents a major challenge, as it typically leads to electrical shorts due to re-sputtering of underlying thick bottom metal layers onto MTJ stack sidewalls.

SUMMARY

Therefore, there is a need for improved designs and techniques that can prevent the deposition of re-sputtered conductive metal particles from underlying (thick) bottom metal layers on sidewalls of the MTJ stack.

Shortcomings of the prior art are overcome and additional advantages are provided through the provision of a method of forming a memory device that includes forming a bottom electrode above an electrically conductive structure embedded in an interconnect dielectric material, forming a magnetic tunnel junction stack above the bottom electrode, the magnetic tunnel junction stack including a magnetic reference layer above the bottom electrode, a tunnel barrier layer above the magnetic reference layer, and a magnetic free layer above the tunnel barrier layer, recessing opposed lateral portions of the magnetic free layer, and forming sidewall spacers on the opposed lateral portions of the magnetic free layer for, at least in part, confining an active region formed by the magnetic free layer and the tunnel barrier layer.

Another embodiment of the present disclosure provides a memory device that includes a bottom electrode above an electrically conductive structure, the electrically conductive structure is embedded in an interconnect dielectric material, a magnetic tunnel junction stack above the bottom electrode, the magnetic tunnel junction stack includes a magnetic reference layer above the bottom electrode, a tunnel barrier layer above the magnetic reference layer, and a laterally-recessed magnetic free layer above the tunnel barrier layer, the laterally-recessed magnetic free layer surrounded by sidewall spacers to confine an active region formed by the laterally-recessed magnetic free and the tunnel barrier layer.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
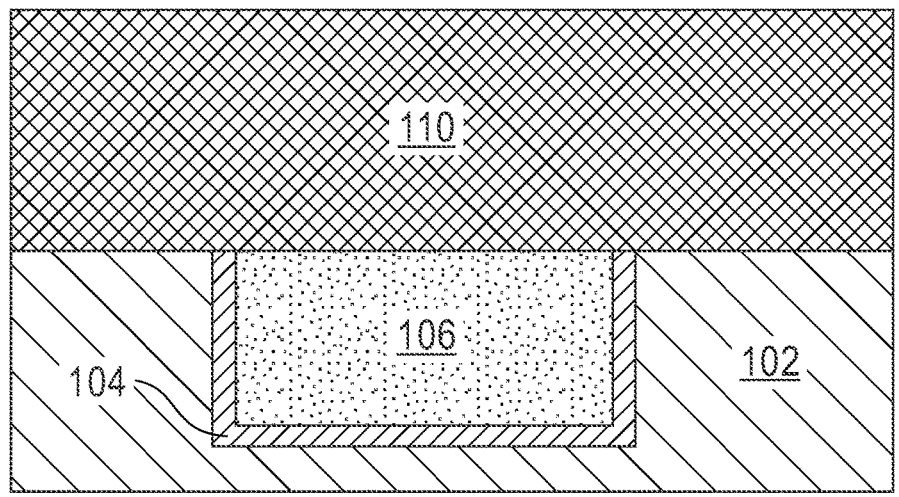
FIG. 1 is a cross-sectional view of a memory device at an intermediate step during a semiconductor manufacturing process, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

MRAM devices include cells or magnetic storage elements for storing data having a magnetically hard layer (i.e., the reference layer) and a magnetically soft layer (i.e., the free layer) separated by a thin dielectric layer (i.e., the tunnel barrier). This configuration is known as a magnetic tunnel junction (MTJ) pillar. MTJ pillar structures typically include a cobalt (Co)-based synthetic anti-ferromagnet (SAF), a CoFeB-based reference layer, a MgO-based tunnel barrier, a CoFeB-based free layer, and cap layers containing materials such as tantalum (Ta) and/or ruthenium (Ru). As mentioned above, embedded MTJ pillar structures are usually formed by patterning of blanket MTJ stacks. Reactive ion etch (RIE), and ion beam etch (IBE) processing of such MTJ stacks presents a major challenge, as it typically leads to shorts due to re-sputtering of thick bottom metal layers onto MTJ stack sidewalls.

Embodiments of the present disclosure generally relates to the field of magnetic storage devices, and more particularly to high performance MRAM devices based on perpendicular MTJ structures. Embodiments of the present disclosure provide an MRAM device with an embedded MTJ pillar structure, and a method of making the same, in which a free layer of the MTJ pillar structure is laterally recessed and surrounded by a dielectric material to prevent re-sputtered conductive metal particles from depositing on the tunnel barrier material of the MTJ pillar structure. Stated differently, the proposed embodiments may prevent back-sputtering of conductive metal particles during etching of the MTJ pillar structure by recessing the free layer of the MTJ pillar structure and depositing a dielectric material around the recessed free layer. This may reduce the risk of electrical shorts which is a common failure mode in traditional MTJ configurations, thereby increasing device reliability.

Embodiments by which the MTJ pillar structure with laterally-recessed free layer can be formed is described in detailed below by referring to the accompanying drawings in FIGS. 1-9.

Referring now to FIG. 1, a cross-sectional view of a memory device 100 at an intermediate step during a semiconductor manufacturing process is shown, according to an embodiment of the present disclosure. The memory device 100 may include any MTJ-containing device such as, for example, MRAM, spin-transfer torque (STT) MRAM, spin-orbit torque (SOT) MRAM and the like. In the embodiment of FIG. 1, the memory device 100 is an MRAM device based on a perpendicular MTJ pillar structure.

According to an embodiment, the memory device 100 includes an electrically conductive structure 106 that is embedded in an interconnect dielectric material layer 102. A diffusion barrier liner 104 can be formed on sidewalls and a bottom wall of the electrically conductive structure 106, as shown in the figure. Collectively, the electrically conductive structure 106, the diffusion barrier liner 104, and the interconnect dielectric material layer 102 provide an interconnect level. It should be noted that at least one other interconnect level and/or a middle-of-the-line (MOL) level may be located beneath the interconnect level including the interconnect dielectric material layer 102, the electrically conductive structure 106, and the diffusion barrier liner 104. These other levels are not shown for clarity.

The interconnect dielectric material layer 102 can be composed of any interconnect dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The electrically conductive structure 106 is composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy.

The diffusion barrier liner 104 is formed along the sidewalls and bottom wall of the electrically conductive structure 106. In some embodiments, no diffusion barrier liner is present. The diffusion barrier liner 104 is composed of a diffusion barrier material (i.e., a material that serves as a barrier to prevent a conductive material such as copper from diffusing there through). Examples of diffusion barrier materials that can be used in providing the diffusion barrier liner 104 may include, but are not limited to, Ta, TaN, Ti, TiN, Ru, RuN, RuTa, RuTaN, W, or WN. In some embodiments, the diffusion barrier liner 104 may include a material stack of diffusion barrier materials. In one example, the diffusion barrier material may be composed of a stack of Ta/TaN.

The interconnect level including the interconnect dielectric material layer 102, the electrically conductive structure 106, and the diffusion barrier liner 104 may be formed utilizing conventional processes that are well-known to those skilled in the art including, for example, a damascene process. So as not to obscure the method of the present application, the techniques used to form the interconnect level including the interconnect dielectric material layer 102, the electrically conductive structure 106, and the diffusion barrier liner 104 are not provided herein.

With continued reference to FIG. 1, a bottom electrode 110 is formed above top surfaces of the interconnect dielectric material layer 102, the electrically conductive structure 106, and the diffusion barrier liner 104. As shown in the figure, the bottom electrode 110 covers an entirety of topmost surfaces of the interconnect dielectric material layer 102, the electrically conductive structure 106, and the diffusion barrier liner 104.

The bottom electrode 110 may be composed of a conductive material such as, for example, Ta, TaN, Ti, TiN, Ru, RuN, RuTa, RuTaN, Co, CoWP, CoN, W, WN or any combination thereof. The bottom electrode 110 may have a thickness varying from approximately 2 nm to approximately 25 nm and ranges there between, although a thickness less than 2 nm and greater than 25 nm may be acceptable. The bottom electrode 110 may be formed by a deposition process such as, for example, sputtering, atomic layer deposition (ALD), chemical vapor deposition (CVD), plasma enhanced chemical vapor deposition (PECVD) or physical vapor deposition (PVD). An etch back process, a planarization process (such as, for example, chemical mechanical polishing), or a patterning process (such as, for example, lithography and etching) may follow the deposition of the conductive material that provides the bottom electrode 110.

In some embodiments (not shown), the bottom electrode 110 is located on a recessed surface of the electrically conductive structure 106. In such embodiments, prior to forming the bottom electrode 110, an upper portion of the electrically conductive structure 106 is removed utilizing a recess etching process, and thereafter the bottom electrode 110 is formed upon the recessed surface of the electrically conductive structure 106. Thus, the bottom electrode 110 would be located on an entirety of the recessed topmost surface of the electrically conductive structure 106. In such embodiments, a topmost surface of the bottom electrode 110 must not be coplanar with a topmost surface of the interconnect dielectric material layer 102. Instead, the topmost surface of the bottom electrode 110 should be located approximately 2 nm to approximately 40 nm above (in z-direction) the topmost surface of the interconnect dielectric material 102. And, a bottommost surface of bottom electrode 110 should be located approximately 2 nm to approximately 40 nm below (in z-direction) the topmost surface of the interconnect dielectric material 102.

In some embodiments, a conductive layer (not shown) including any conductive material can be formed above the bottom electrode 110. In some embodiments, a material that has, or combination of materials that have, a lower atomic weight than the conductive material that provides the bottom electrode 110 can be used as the conductive layer (not shown). Typically, the conductive material that provides the conductive layer has a lower sticking coefficient than that of the bottom electrode 110. Illustrative examples of conductive materials that can be used as the conductive layer can include one of the conductive materials mentioned above for the bottom electrode 110 with the proviso that the selected conductive material of the conductive layer (not shown) has a lower atomic weight than the conductive material of bottom electrode 110. In one example, and when the bottom electrode 110 is composed of TaN, then the conductive layer can be composed of Ti or TiN, Nb or NbN.

If present, the conductive layer (not shown) can be formed by a deposition process such as, for example, sputtering, atomic layer deposition (ALD), chemical vapor deposition (CVD), plasma enhanced chemical vapor deposition (PECVD) or physical vapor deposition (PVD). The thickness of the conductive layer may be from 20 nm to 500 nm. Other thicknesses besides the specified range can also be employed as the thickness of the conductive layer.

Figure 2:
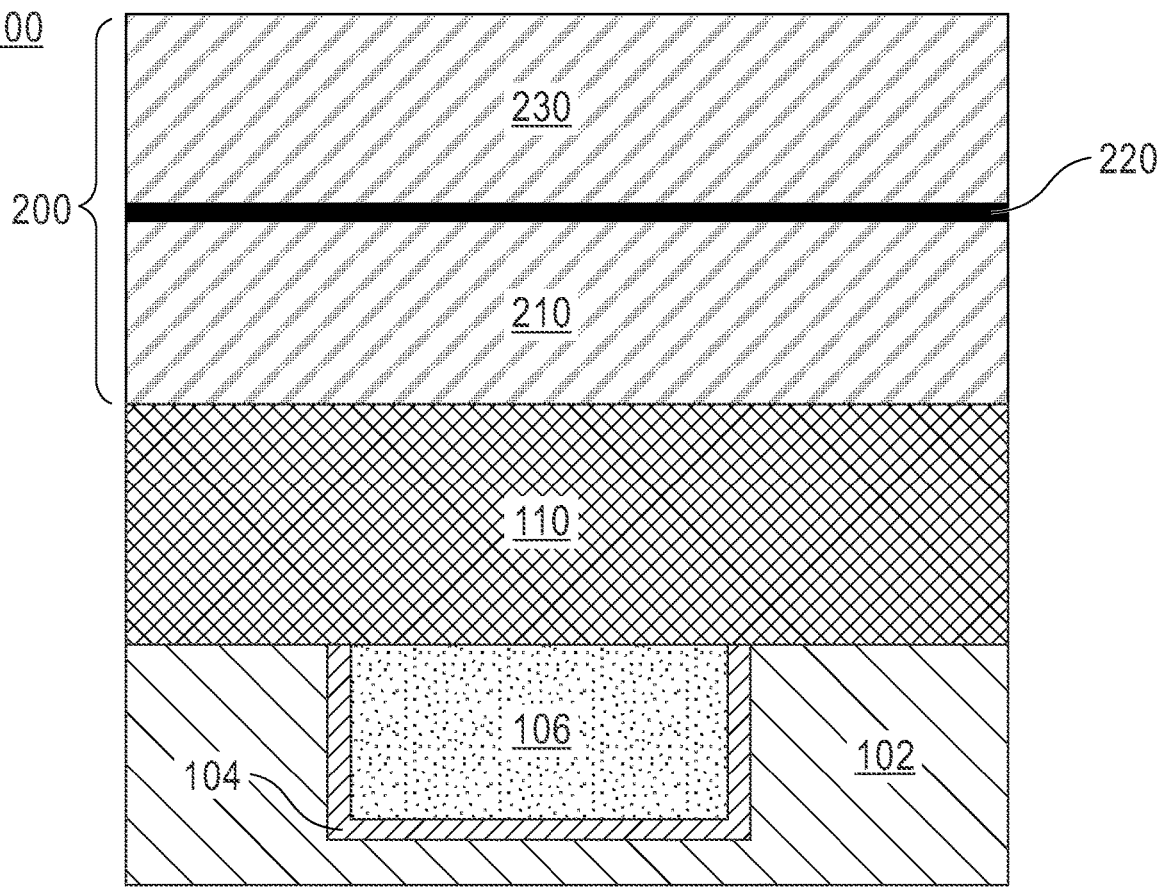
FIG. 2 is a cross-sectional view of the memory device depicting forming a magnetic tunnel junction stack above a bottom electrode, according to an embodiment of the present disclosure.

Referring now to FIG. 2, a cross-sectional view of the memory device 100 is shown depicting forming an MTJ stack 200 above the bottom electrode 110, according to an embodiment of the present disclosure. The MTJ stack 200 may include at least a magnetic reference layer 210, a tunnel barrier layer 220, and a magnetic free layer 230 as depicted in FIG. 2. It should be noted that other MTJ stack 200 configurations are possible such as, for example, the magnetic free layer 230 being located at the bottom of the MTJ stack 200 and the magnetic reference layer 210 being at the top of the MTJ stack 200.

In some embodiments, the MTJ stack 200 may also include a non-magnetic spacer layer (not shown) located on the magnetic free layer, a second magnetic free layer located on the non-magnetic spacer layer, and/or a MTJ cap layer located on the magnetic free layer 230 or on the second magnetic free layer. The various material layers of the MTJ stack 200 can be formed by utilizing one or more deposition processes such as, for example, plating, sputtering, plasma enhanced atomic layer deposition (PEALD), plasma enhanced chemical vapor deposition (PECVD) or physical vapor deposition (PVD).

The magnetic reference layer 210 has a fixed magnetization. The magnetic reference layer 210 may be composed of a metal or metal alloy (or a stack thereof) that includes one or more metals exhibiting high spin polarization. In alternative embodiments, exemplary metals for the formation of the magnetic reference layer 210 may include iron, nickel, cobalt, chromium, boron, or manganese. Exemplary metal alloys may include the metals exemplified by the above. In another embodiment, the magnetic reference layer 210 may be a multilayer arrangement having (1) a high spin polarization region formed from a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier layer 220 is composed of an insulator material and is formed at such a thickness as to provide an appropriate tunneling resistance. Exemplary materials for the tunnel barrier layer 220 may include magnesium oxide, aluminum oxide, and titanium oxide, or materials of higher electrical tunnel conductance, such as semiconductors or low-bandgap insulators.

The magnetic free layer 230 may be composed of a magnetic material (or a stack of magnetic materials) with a magnetization that can be changed in orientation relative to the magnetization orientation of the magnetic reference layer 210. Exemplary magnetic materials for the magnetic free layer 230 include alloys and/or multilayers of cobalt, iron, alloys of cobalt-iron, nickel, alloys of nickel-iron, and alloys of cobalt-iron-boron.

It should be noted that some elements and/or features of the memory device 100 are illustrated in the figures but not described in detail in order to avoid unnecessarily obscuring the presented embodiments. For illustration purposes only, without intent of limitation, only one MTJ stack 200 with a corresponding bottom electrode 110 is depicted in the memory device 100. As may be understood by those skilled in the art, the memory device 100 may include more than one MTJ stack 200.

Figure 3:
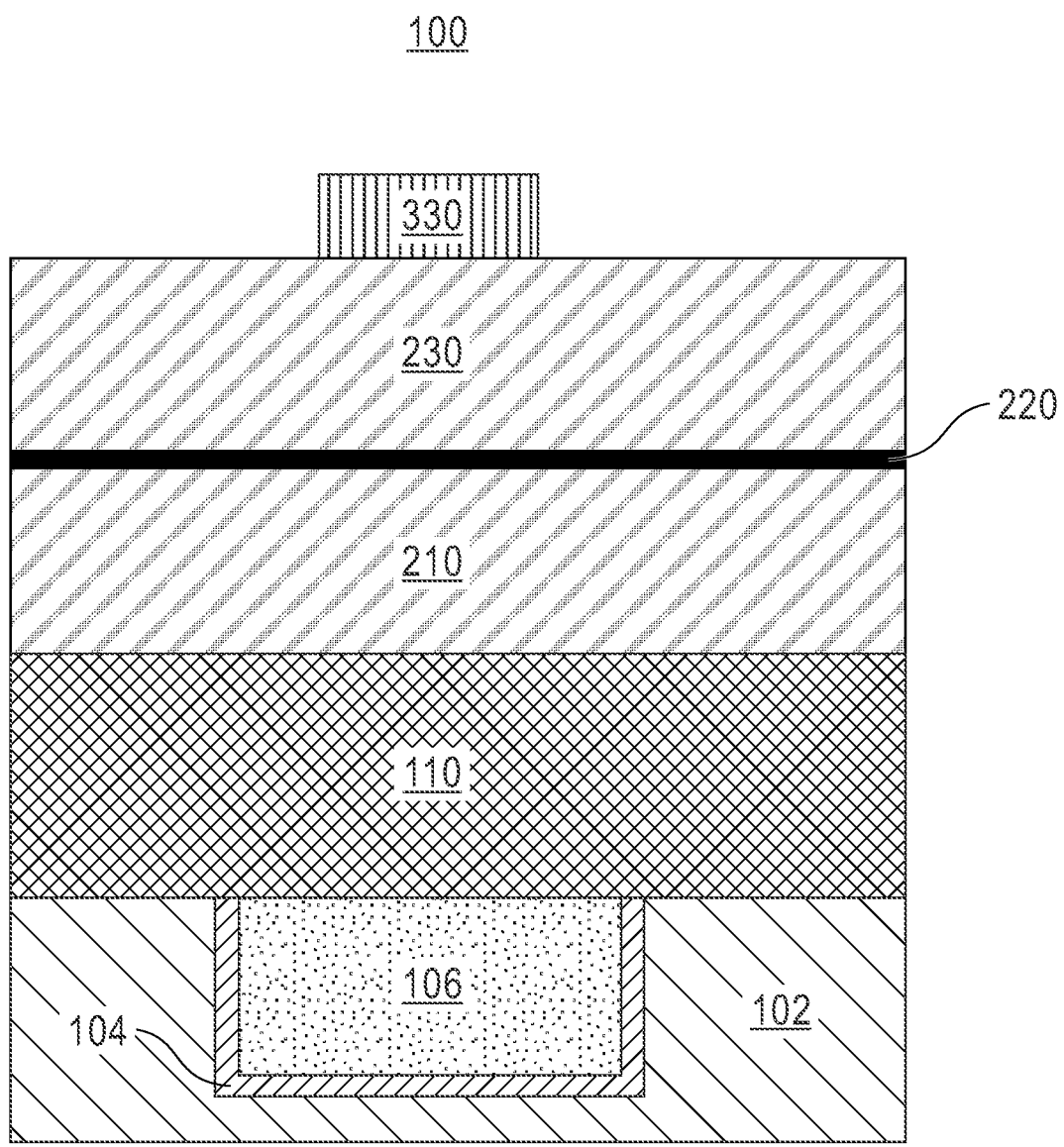
FIG. 3 is a cross-sectional view of the memory device depicting forming a patterned hardmask layer, according to an embodiment of the present disclosure.

Referring now to FIG. 3, a cross-sectional view of the memory device 100 is shown depicting forming a patterned hardmask layer 330, according to an embodiment of the present disclosure.

The patterned hardmask layer 330 may be composed of a metal (not shown) such as TaN, TaAlN, WN as the bottommost material, and a dielectric material (not shown) such as silicon dioxide, silicon nitride, silicon carbide, and the like, as the topmost material. The hardmask layer 330 can be deposited by any suitable deposition method known in the art. It should be noted that the metal layer in the patterned hardmask layer 330 is not sacrificial, while the dielectric layer in the patterned hardmask layer 330 is sacrificial, in that the dielectric layer will be removed after completion of the patterning process. In some embodiments, top layers (not shown) of the MTJ stack 200 may act as both a hardmask for etching the MTJ stack 200 and as an interlayer conductor channel.

A (vertical) thickness of the hardmask layer 330 may vary between approximately 10 nm to approximately 100 nm, although other thicknesses above or below this range may be used as desired for a particular application. It should be noted that the process of forming and patterning the hardmask layer 330 for etching the underlying MTJ stack 200 is standard and well known in the art.

Figure 4:
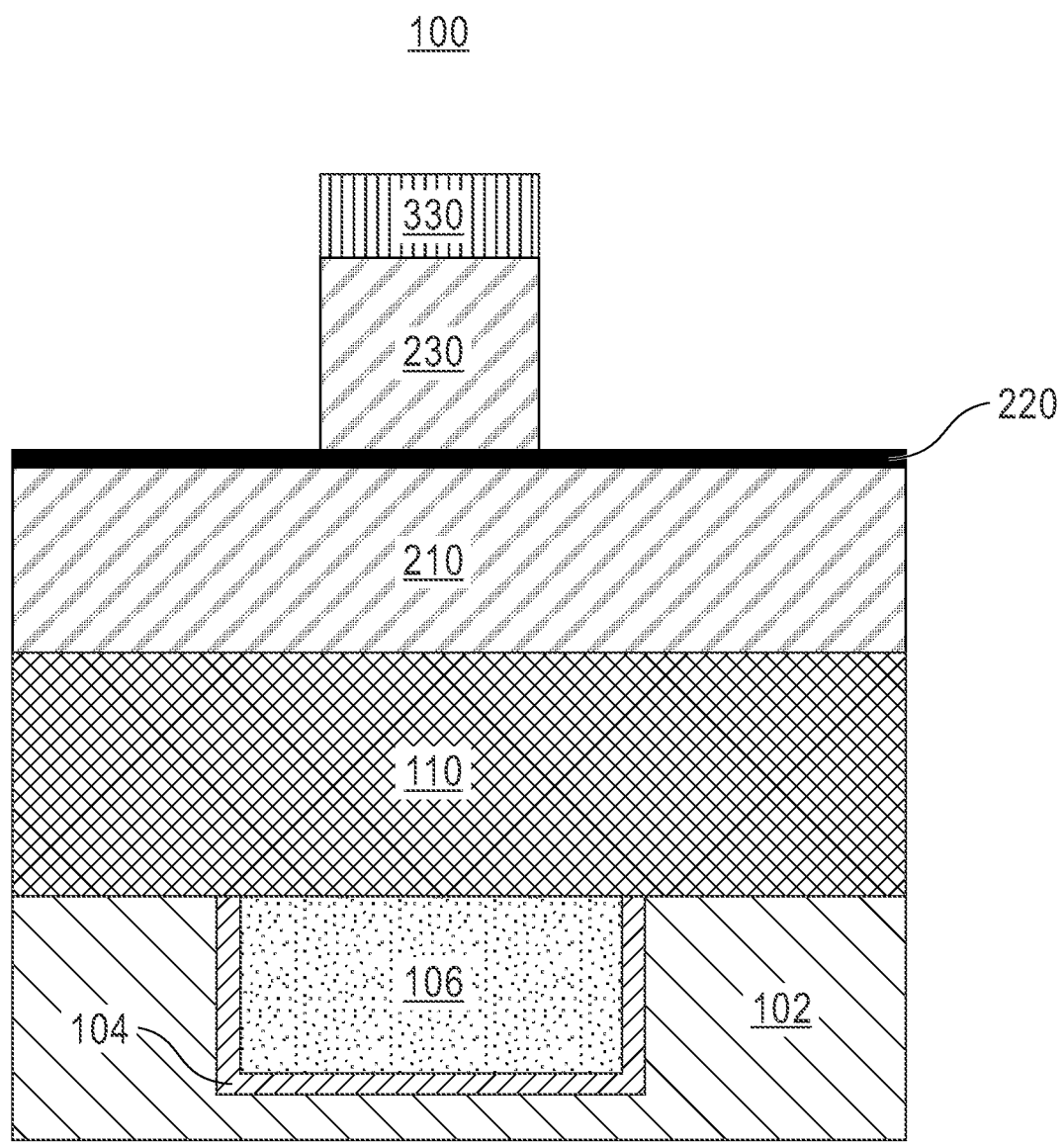
FIG. 4 is a cross-sectional view of the memory device depicting etching a magnetic free layer, according to an embodiment of the present disclosure.

Referring now to FIG. 4, a cross-sectional view of the memory device 100 depicting etching the magnetic free layer 230 is shown, according to an embodiment of the present disclosure. In this embodiment, a dry etching technique such as a reactive-ion etching (RIE) or ion beam etching (IBE) can be implemented to recess the magnetic free layer 230, as depicted in the figure. The magnetic free layer 230 is laterally recessed until a (horizontal) thickness of the magnetic free layer 230 is between approximately 200 nm to approximately 10 nm.

The process of patterning the MTJ stack 200 consists of steps well-known in the art, which generally include forming a pattern on a photoresist layer (not shown) that is transferred to the patterned hardmask layer 330 and used to pattern the underlying MTJ stack 200 (and bottom electrode 110) via any suitable etching technique. In this embodiment, patterning of the MTJ stack 200 starts by laterally recessing the magnetic free layer 230, then the etching process is stopped at an uppermost surface of the tunnel barrier layer 220. As will be described below, a spacer material is deposited on the memory device 100 after recessing the magnetic free layer 230.

Alternatively or additionally, in some embodiments, the etching process may continue until an uppermost surface of the magnetic reference layer 210. Thus, in such instances, the tunnel barrier layer 220 may also be laterally recessed. In some embodiments, the tunnel barrier layer 220 can be partially or completely removed during the etching process.

Figure 5:
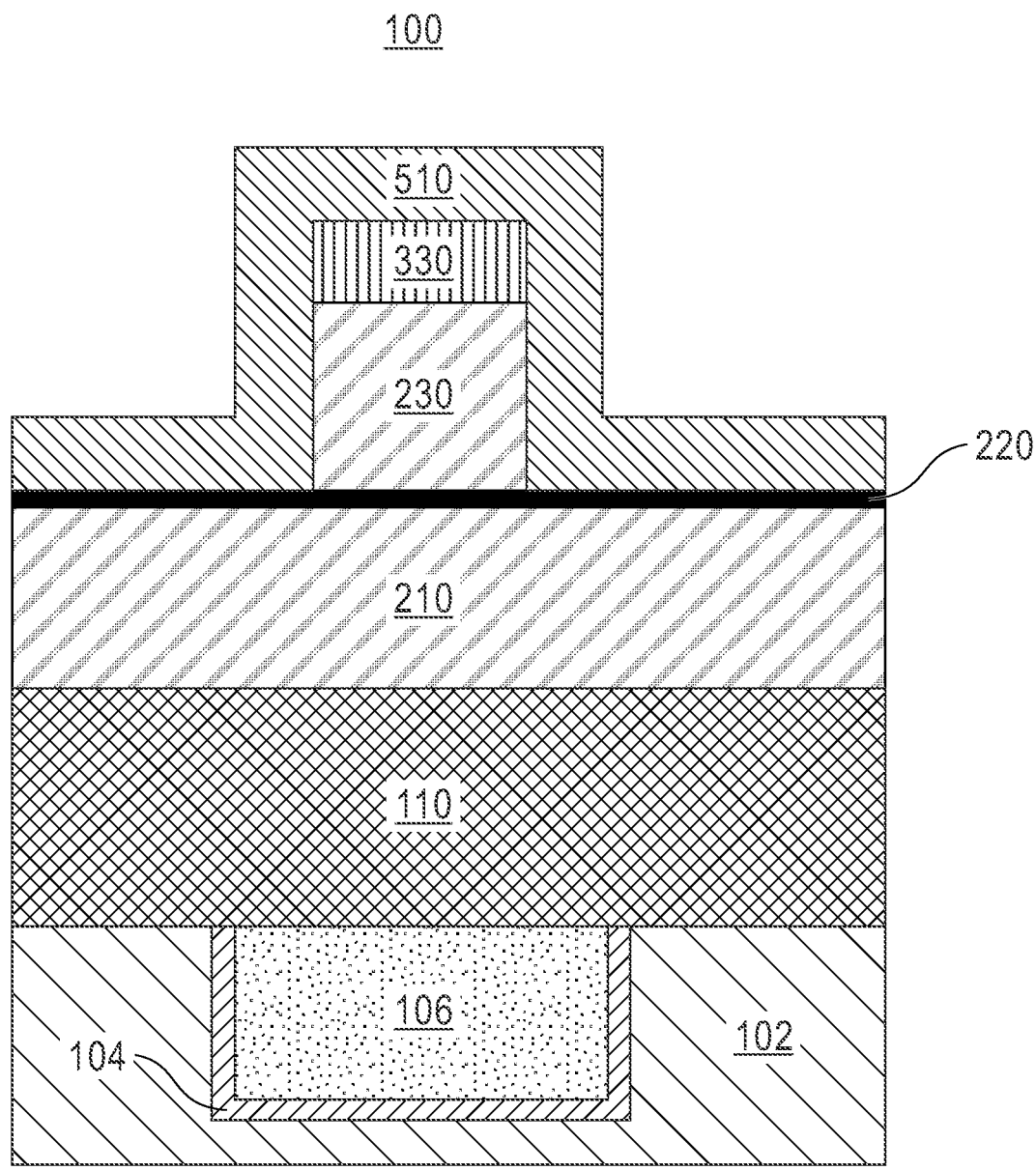
FIG. 5 is a cross-sectional view of the memory device depicting forming a spacer material, according to an embodiment of the present disclosure.

Referring now to FIG. 5, a cross-sectional view of the memory device 100 depicting the formation of a spacer material 510 is shown, according to an embodiment of the present disclosure. The spacer material 510 can be deposited on the memory device 100 and subsequently etched (FIG. 6) to form sidewall spacers 610 as configured in FIG. 6.

The spacer material 510 may include an insulator material such as an oxide, nitride, oxynitride, silicon carbon oxynitride, silicon boron oxynitride, low-k dielectric, or any combination thereof. Standard deposition and etching techniques may be used to form the spacer material 510.

Figure 6:
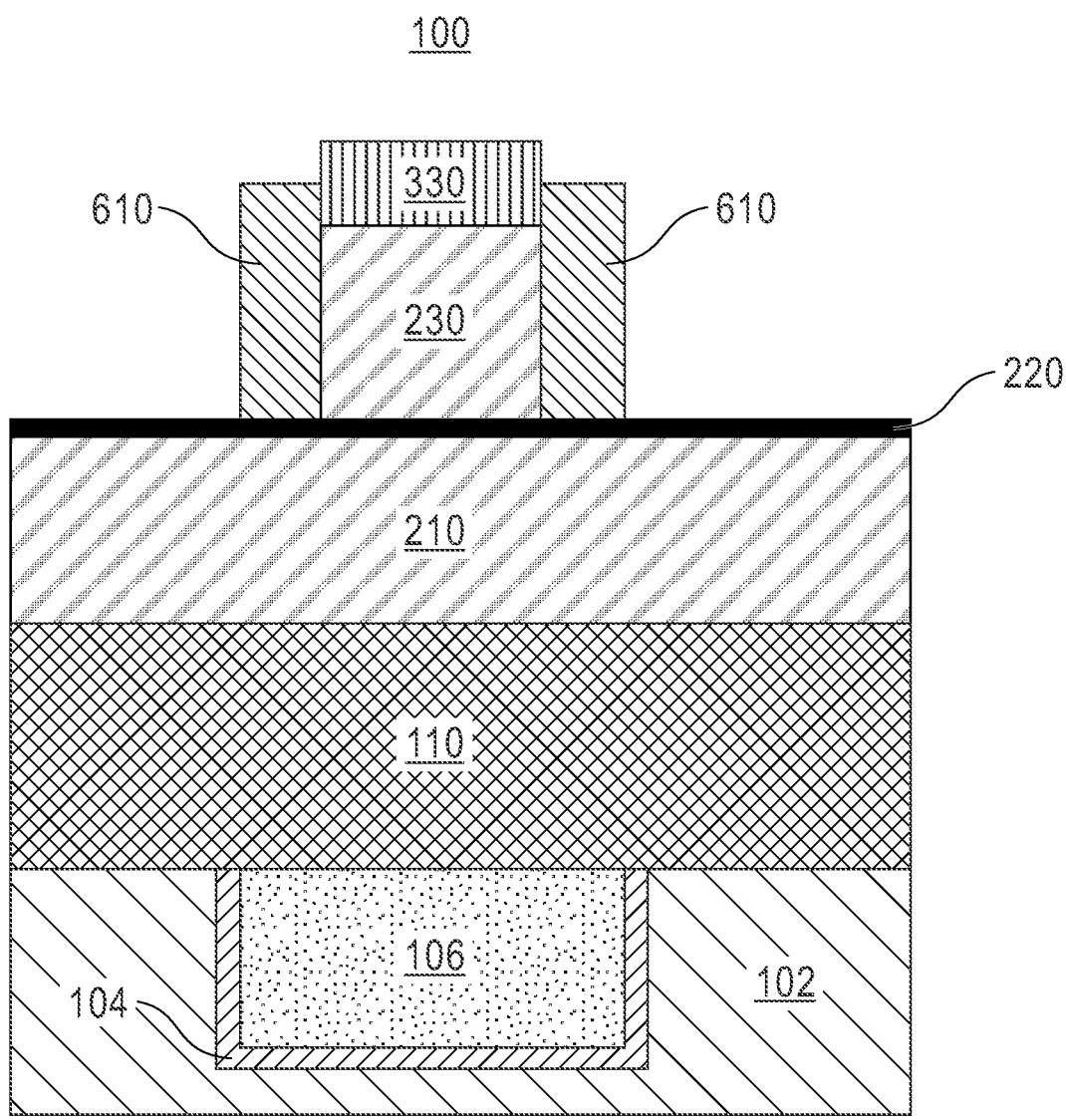
FIG. 6 is a cross-sectional view of the memory device depicting forming sidewall spacers from the spacer material, according to an embodiment of the present disclosure.

Referring now to FIG. 6, a cross-sectional view of the memory device 100 depicting forming sidewall spacers 610 from the spacer material 510 (FIG. 5) is shown, according to an embodiment of the present disclosure. The spacer material 510 (FIG. 5) can be etched using, for example, an anisotropic etch, to form the sidewall spacers 610. As known by those skilled in the art, the insulator material forming the spacer material 510 (FIG. 5) is removed from all horizontal surfaces of the memory device 100 during the etching process.

According to an embodiment, the sidewall spacers 610 are positioned on opposing sidewalls of the magnetic free layer 230 and a bottom portion of the patterned hardmask layer 330. A bottom surface of the sidewall spacers 610 is directly above the tunnel barrier layer 220. Thus, the sidewall spacers 610 confine an active region of the memory device 100 formed by the magnetic free layer 230 and portions of the tunnel barrier layer 220 underneath the magnetic free layer 230. This configuration may prevent back-sputtering of metal particles from bottom metal layers, such as the bottom electrode 110, onto the tunnel barrier layer 220 during patterning of the MTJ stack 200, thus preventing electrical shorts or leakage current between bottom metal layers and top metal layers within the MTJ stack 200.

According to an embodiment, a (horizontal) thickness of the sidewall spacers 610 may vary between approximately 3 nm to approximately 40 nm, although other thicknesses above or below this range may be used as desired for a particular application.

Figure 7:
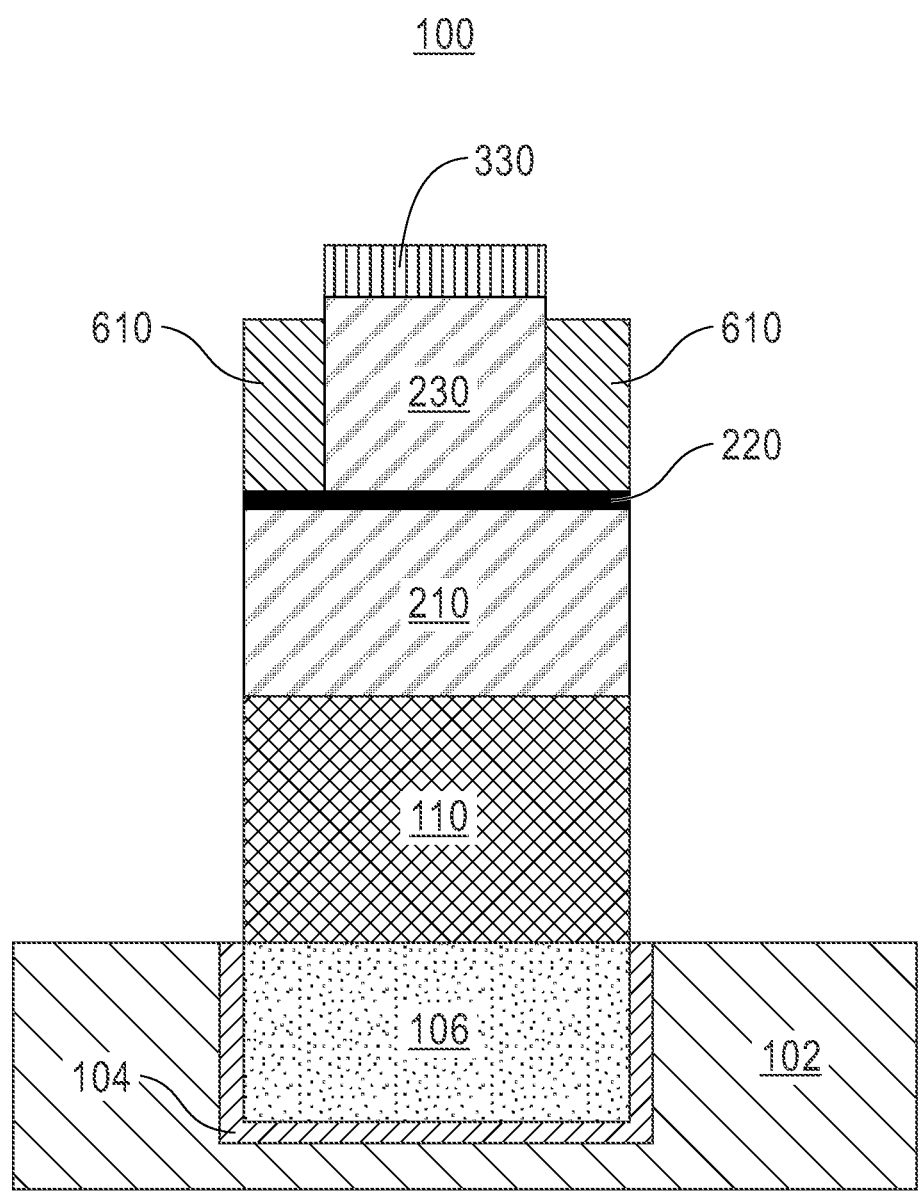
FIG. 7 is a cross-sectional view of the memory device depicting etching a bottom portion of the magnetic tunnel junction stack and bottom electrode, according to an embodiment of the present disclosure.

Referring now to FIG. 7, a cross-sectional view of the memory device 100 depicting etching a bottom portion of the MTJ stack 200 and the bottom electrode 110 is shown, according to an embodiment of the present disclosure.

In this embodiment, patterning of the MTJ stack 200 continues by etching remaining bottom layers of the MTJ stack 200 including the magnetic reference layer 210 and the tunnel barrier layer 220. Any suitable etching technique can be used to recess the magnetic reference layer 210 and the tunnel barrier layer 220. For example, the magnetic reference layer 210 and the tunnel barrier layer 220 can be recessed using a dry etching technique such as reactive ion etch (RIE), or ion beam etch (IBE). A (horizontal) thickness of the sidewall spacers 610 together with a thickness of the magnetic free layer 230 indicate a thickness of the magnetic reference layer 210 and the tunnel barrier layer 220. Stated differently, the magnetic reference layer 210 and the tunnel barrier layer 220 of the magnetic tunnel junction stack 200 located below the magnetic free layer 230 are recessed until a thickness of the magnetic reference layer 210 and the tunnel barrier layer 220 is equal to a thickness of the sidewall spacers 610 plus a thickness of the magnetic free layer 230.

The patterning process continues by recessing the bottom electrode 110. In an embodiment, an ion beam etch (IBE) can be performed to recess the bottom electrode 110 (i.e., electrode open), as depicted in the figure.

Figure 8:
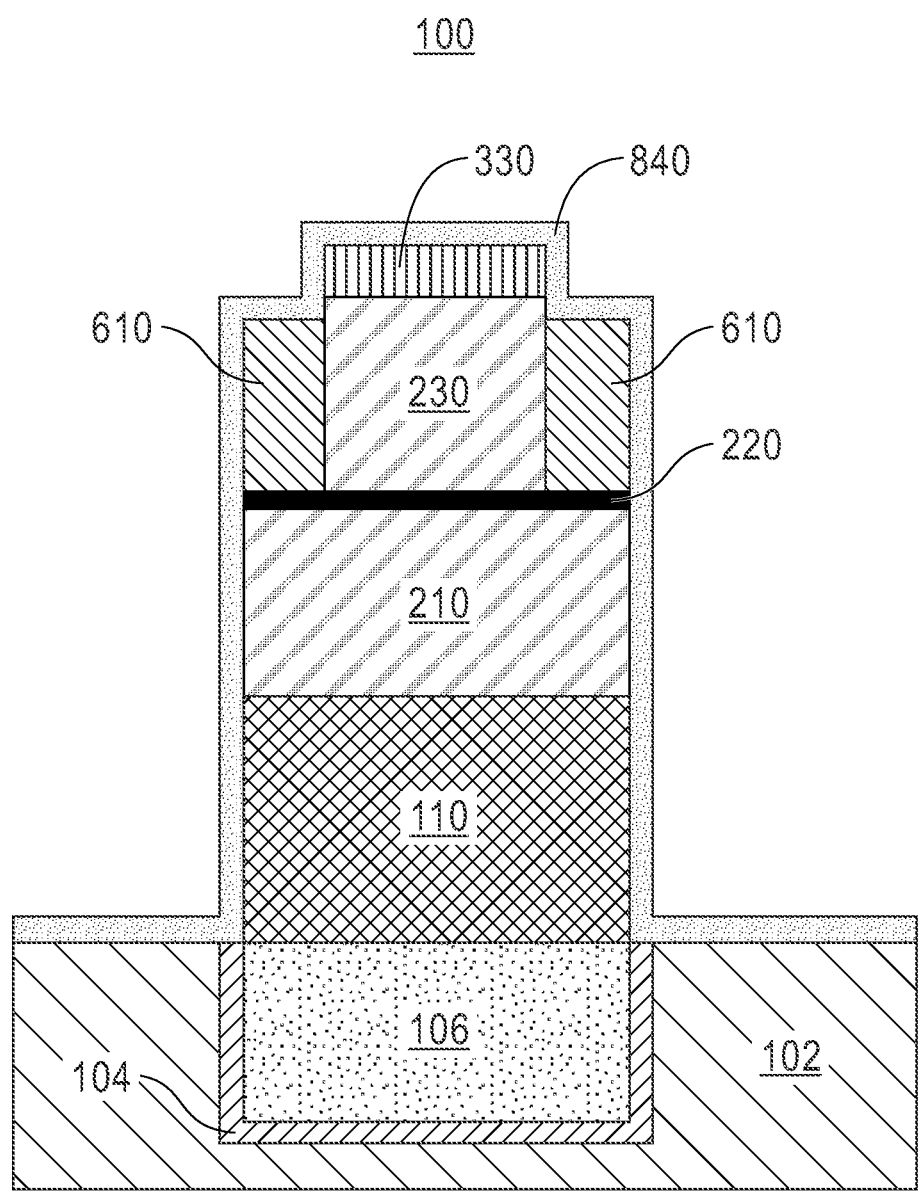
FIG. 8 is a cross-sectional view of the memory device depicting forming a dielectric capping layer, according to an embodiment of the present disclosure.

Referring now to FIG. 8, a cross-sectional view of the memory device 100 depicting forming a dielectric capping layer 840 is shown, according to an embodiment of the present disclosure.

The dielectric capping layer 840 is conformally deposited on the memory device 100. As depicted in the figure, portions of the dielectric capping layer 840 perpendicular to the interconnect dielectric material layer 102 are located laterally adjacent to the bottom electrode 110, the magnetic reference layer 210, the tunnel barrier layer 220, sidewall spacers 601 and sidewalls of the hardmask layer 330. Portions of the dielectric capping layer 840 parallel to the interconnect dielectric material layer 102 are located above the interconnect dielectric material layer 102 and a top surface of the hardmask layer 330. Optionally, in another embodiment of the invention, the portions of the dielectric capping layer 840 parallel to the interconnect dielectric material layer 102 are removed by a directional etch process such as RIE.

The dielectric capping layer 840 may be composed of any dielectric material such as, for example, SiC, Si3N4, SiO2, a carbon doped oxide, a nitrogen and hydrogen doped silicon carbide SiC(N,H) or multilayers thereof. The dielectric capping layer 840 can be formed utilizing a conventional deposition process such as, for example, chemical vapor deposition (CVD), plasma enhanced chemical vapor deposition (PECVD), chemical solution deposition, evaporation, or plasma enhanced atomic layer deposition (PEALD).

Figure 9:
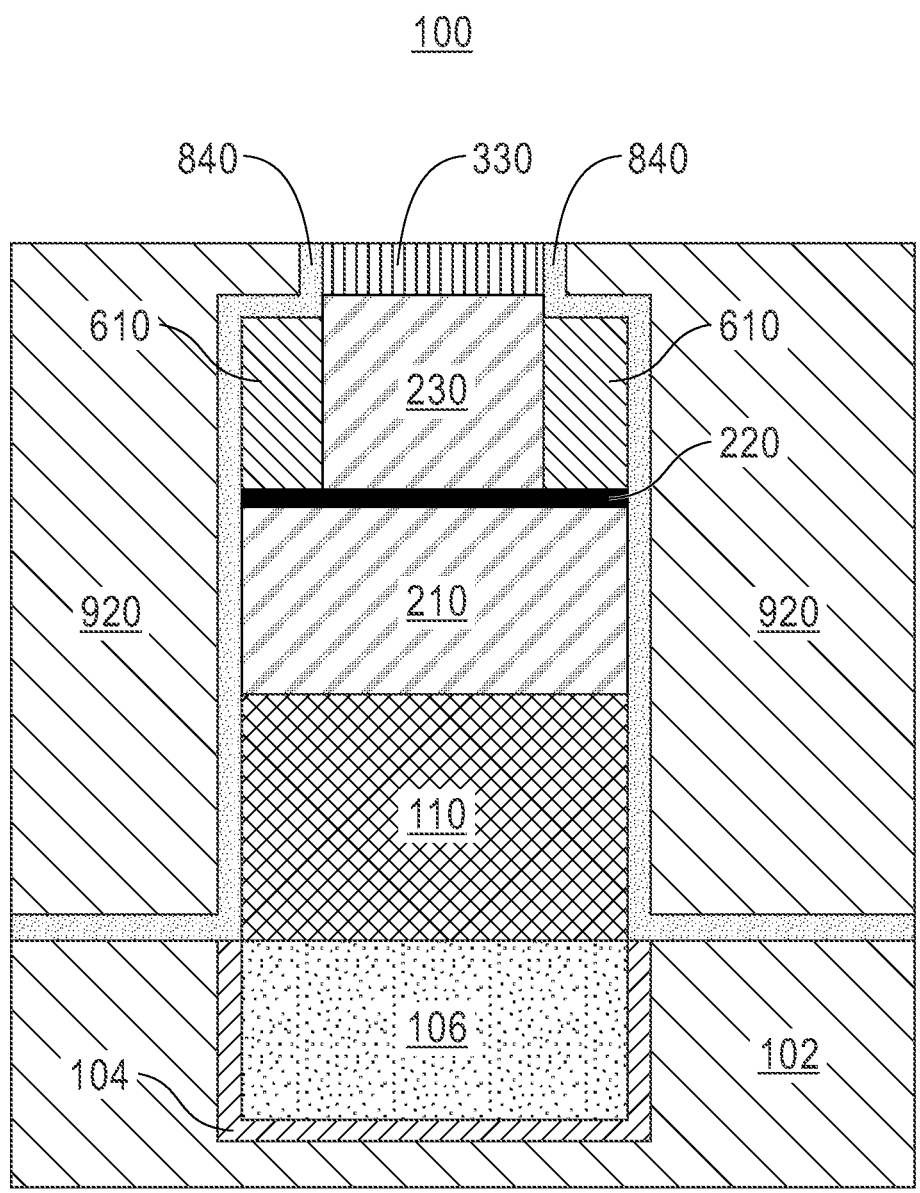
FIG. 9 is a cross-sectional view of the memory device depicting forming a dielectric filling layer, according to an embodiment of the present disclosure.

Referring now to FIG. 9, a cross-sectional view of the memory device 100 depicting forming a dielectric filling layer 920 is shown, according to an embodiment of the present disclosure. Any suitable deposition process can be used to form the dielectric filling layer 920 in the memory device 100. The dielectric filling layer 920 may be made of analogous materials and formed in similar ways as the interconnect dielectric material layer 102. In some embodiments, a planarization process may be conducted on the memory device 100 after deposition of the dielectric filling layer 920.

Therefore, by recessing the magnetic free layer 230 and forming the sidewalls spacers 610 on opposing sides of the magnetic free layer 230 prior to patterning of the MTJ stack 200 and bottom electrode 110, back sputtering of metal particles can be prevented during subsequent etching of bottom metal layers. More particularly, the laterally-recessed magnetic free layer 230 surrounded by the sidewall spacers 610 confines the active MTJ region such that re-sputtering does not lead to electrical shorts in the memory device 100, thereby improving device reliability.

Further, embodiments of the present disclosure, may extend scalability of embedded MRAM devices and other embedded memory elements (such as RRAM) due to lack of tunnel barrier or metal-oxide device layer shorts.

Finally, embodiments of the present disclosure, provide a method including a sequence of processing steps that can be conducted using only one chamber, thereby avoiding exposure of the MTJ stack 200 to oxygen. Specifically, the processing steps described in FIGS. 3-8 can be performed in the same processing chamber, thus facilitating the manufacturing process and reducing exposure of the MTJ stack 200 to oxygen.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory device, comprising:
    a bottom electrode above an electrically conductive structure, the electrically conductive structure being embedded within an interconnect dielectric material;
    a diffusion barrier liner located on a bottom surface and lateral sidewalls of the electrically conductive structure; and
    a magnetic tunnel junction stack above the bottom electrode, the magnetic tunnel junction stack comprising a magnetic reference layer above the bottom electrode, a tunnel barrier layer above the magnetic reference layer, and a magnetic free layer above the tunnel barrier layer, the magnetic free layer being laterally recessed with respect to the tunnel barrier layer, the magnetic free layer surrounded by sidewall spacers to confine an active region formed by the magnetic free and the tunnel barrier layer.

2. The memory device of claim 1, further comprising:
    a patterned hardmask layer above the magnetic free layer.

3. The memory device of claim 2, wherein the patterned hardmask layer comprises a metal as a bottommost material, and a sacrificial dielectric material as a topmost material.

4. The memory device of claim 1, a thickness of the magnetic reference layer and the tunnel barrier layer is equal to a thickness of the sidewall spacers plus a thickness of the magnetic free layer.

5. The memory device of claim 2, further comprising:
    a dielectric capping layer above the magnetic tunnel junction stack, above top surfaces of the patterned hardmask layer, and above top surfaces of the interconnect dielectric material.

6. The memory device of claim 5, further comprising:
    a dielectric filling above the capping layer.

7. The memory device of claim 1, further comprising:
    a conductive layer above the bottom electrode, wherein a conductive material forming the conductive layer has a lower atomic weight than a conductive material forming the bottom electrode.

8. The memory device of claim 1, wherein the magnetic tunnel junction stack further comprises:
    a non-magnetic spacer layer located on the magnetic free layer, a second magnetic free layer located on the non-magnetic spacer layer, and a magnetic tunnel junction cap layer located on at least one of the magnetic free layer and the second magnetic free layer.

* * * * *